United States Patent
Hsu et al.

(10) Patent No.: US 12,135,499 B2
(45) Date of Patent: Nov. 5, 2024

(54) RETICLE ENCLOSURE FOR LITHOGRAPHY SYSTEMS

(71) Applicant: TAIWAN SEMICONDUCTOR MANUFACTURING COMPANY, LTD., Hsinchu (TW)

(72) Inventors: Pei-Cheng Hsu, Taipei (TW); Ta-Cheng Lien, Cyonglin Township (TW); Hsin-Chang Lee, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 302 days.

(21) Appl. No.: 17/461,392

(22) Filed: Aug. 30, 2021

(65) Prior Publication Data

US 2023/0066653 A1    Mar. 2, 2023

(51) Int. Cl.
*G03F 1/22* (2012.01)
*G03F 1/66* (2012.01)
*G03F 7/00* (2006.01)

(52) U.S. Cl.
CPC .................. *G03F 1/66* (2013.01); *G03F 1/22* (2013.01); *G03F 7/70033* (2013.01)

(58) Field of Classification Search
None
See application file for complete search history.

(56) References Cited

U.S. PATENT DOCUMENTS

| | | | |
|---|---|---|---|
| 6,841,312 B1* | 1/2005 | Kalk | G03F 1/64 355/75 |
| 8,796,666 B1 | 8/2014 | Huang et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 9,618,837 B2 | 4/2017 | Lu et al. | |
| 9,869,928 B2 | 1/2018 | Huang et al. | |
| 9,869,934 B2 | 1/2018 | Huang et al. | |
| 9,869,939 B2 | 1/2018 | Yu et al. | |
| 10,353,284 B2 | 7/2019 | Jonckheere et al. | |
| 11,104,496 B2 | 8/2021 | Chuang et al. | |
| 2005/0095829 A1* | 5/2005 | Hara | G03F 7/7075 438/584 |
| 2006/0257754 A1* | 11/2006 | Harubayashi | G03F 1/62 430/323 |

(Continued)

FOREIGN PATENT DOCUMENTS

| | | | |
|---|---|---|---|
| CN | 108873600 A | 11/2018 | |
| CN | 213240796 U | 5/2021 | |

(Continued)

*Primary Examiner* — Martin J Angebranndt
(74) *Attorney, Agent, or Firm* — STUDEBAKER & BRACKETT PC

(57) ABSTRACT

A reticle enclosure includes a base including a first surface, a cover including a second surface and disposed on the base, wherein the base and the cover form an internal space therebetween to include a reticle, and a layer of elastomer or gelatinous material disposed on at least one of the first surface and the second surface, wherein the layer of elastomer or gelatinous material is disposed between the base and the cover and contacts either the base or the cover.

18 Claims, 14 Drawing Sheets

(56) References Cited

U.S. PATENT DOCUMENTS

| | | | |
|---|---|---|---|
| 2009/0301917 A1 | 12/2009 | Kolbow et al. | |
| 2011/0236807 A1* | 9/2011 | Shirasaki | G03F 1/64 |
| | | | 430/5 |
| 2012/0308922 A1* | 12/2012 | Lin | G03F 1/64 |
| | | | 430/5 |
| 2014/0116920 A1 | 5/2014 | Lee et al. | |
| 2015/0131071 A1* | 5/2015 | Kim | G03F 1/62 |
| | | | 355/72 |
| 2016/0187772 A1* | 6/2016 | Sekihara | G03F 1/62 |
| | | | 430/5 |
| 2018/0329290 A1* | 11/2018 | Jonckheere | G03F 1/64 |
| 2019/0137865 A1* | 5/2019 | Lin | G03F 1/22 |
| 2020/0211876 A1 | 7/2020 | Raschke et al. | |
| 2021/0109439 A1 | 4/2021 | Eggum et al. | |

FOREIGN PATENT DOCUMENTS

| | | | | |
|---|---|---|---|---|
| JP | 03020740 A * | 1/1991 | | |
| JP | 05232690 A * | 9/1993 | | |
| JP | 07175206 A * | 7/1995 | | G03F 1/64 |
| JP | 2000227653 A * | 8/2000 | | G03F 1/84 |
| JP | 2002236352 A * | 8/2002 | | G03F 1/84 |
| JP | 2008158116 A * | 7/2008 | | G03F 1/64 |
| TW | 202109181 A | 3/2021 | | |
| WO | WO-2020088394 A1 * | 5/2020 | | B65D 85/00 |

* cited by examiner

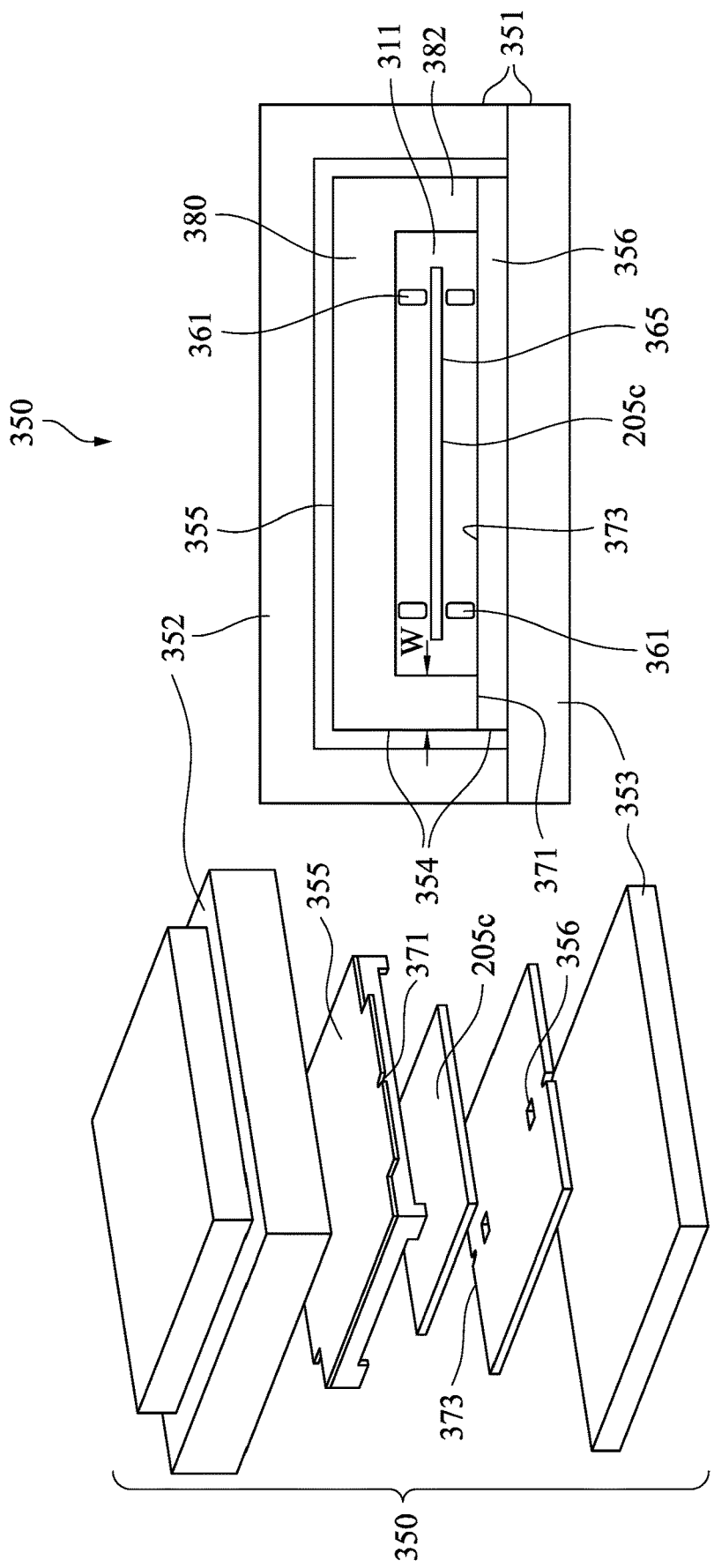

RETICLE ENCLOSURE FOR LITHOGRAPHY SYSTEMS

BACKGROUND

A lithographic apparatus projects a pattern from a patterning device (e.g., a photo mask) onto a layer of radiation-sensitive material (resist) provided on the semiconductor substrate. When a photo mask is not used (stored) or transferred from a storage to an lithography apparatus, such as a stepper or a scanner, the photo mask is appropriately protected from contamination such as dust or particles by being placed in a mask case (pod).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A is a schematic exploded view and FIG. 3B is a cross-sectional diagram illustrating an EUV reticle pod.

DETAILED DESCRIPTION

Figure 1A:
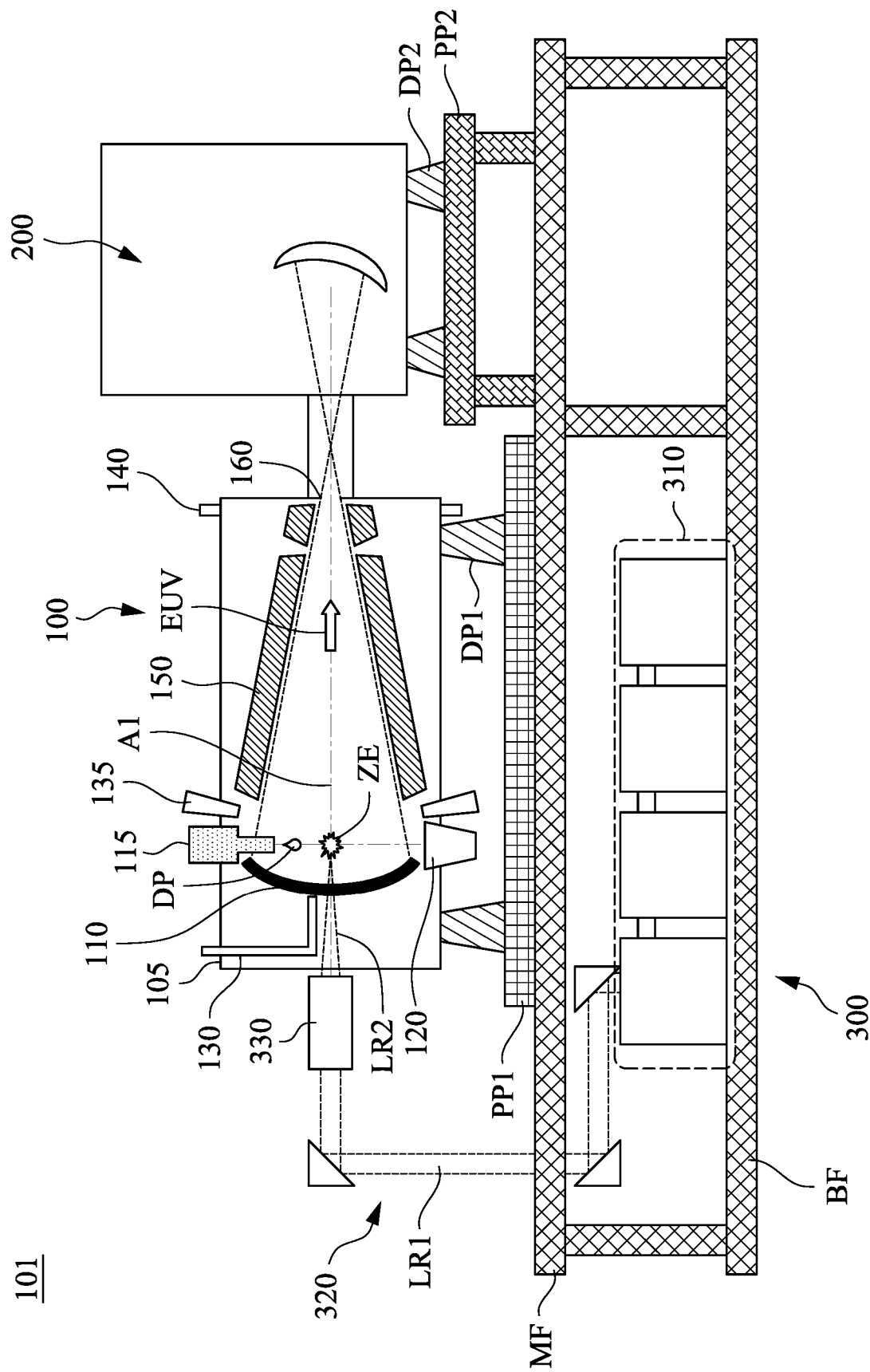
FIG. 1A is a schematic view of an extreme ultraviolet (EUV) lithography system with a laser produced plasma (LPP) EUV radiation source, constructed in accordance with some embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in between the described operations, and the order of operations may be changed. In the present disclosure, the phrase "at least one of A, B and C" means either one of A, B, C, A+B, A+C, B+C or A+B+C, and does not mean one from A, one from B and one from C, unless otherwise explained.

The present disclosure is generally related to extreme ultraviolet (EUV) lithography system and methods. Embodiments disclosed herein are directed to an improved design of an extreme ultraviolet (EUV) reticle pod used for transporting and storing photo masks or blank substrates, and more specifically, to an EUV reticle pod including an inner pod that is designed to reduce particles generated due to friction between the inner pod cover and the inner pod base. Thus exposure of the photo mask (reticle) contained within the EUV reticle pod to the particulate matter is reduced, and the contamination of the extreme ultraviolet lithography system (e.g., of the exposure tool) by the particulate matter is limited.

A semiconductor chip patterned using photolithography (for example, extreme ultraviolet photolithography or EUV photolithography using 13.5 nm wavelength for patterning) requires a mask or a photo-mask (also called a 'reticle') which is contained in a standardized carrier for transfer to different positions in a clean room or in different clean rooms for different processes. For example, a blank substrate is transferred in the standardized carrier using manual or robotic methods to different locations or clean rooms for cleaning and mask fabrication. The fabricated mask is also transferred inside the standardized carrier to different locations or clean rooms for photolithography processes, or storage before or after use. The mask carrier (also referred to as a mask container, a mask pod, or a mask box) includes an inner pod and an outer pod. The inner pod contacts the blank substrate or mask, and includes an inner pod cover and an inner pod base. The inner pod cover and the inner pod base of the inner pod are designed to fit each other with high accuracy.

The inner pod cover and the inner pod base are made of metal materials such as aluminum alloy. The aluminum alloy includes, for example, aluminum-magnesium (Al-Mg) alloy. While providing the required support and protection to the mask or blank substrate secured in the inner pod, the aluminum alloy construction makes the inner pod light weight and thus the inner pod be handled with relative ease either manually or using the robotic apparatus. However, the aluminum alloy has poor mechanical properties and can be damaged easily. In order to improve the mechanical properties of the inner pod, the aluminum alloy structure is coated with nickel, nickel alloy, chromium, or chromium alloy.

The material used in the coating is a relatively hard material. Contact between the inner pod cover and the inner pod base, for instance when opening or closing the inner pod, causes friction between the inner pod cover and the inner pod base. At times, the robotic apparatus handling the inner pod may malfunction causing inner pod to tilt and thereby the inner pod cover to slide (and causing friction) over the inner pod base. The friction generates particles that can fall on the inner pod base and/or the mask or blank substrate secured on the inner pod base. These particles contaminate the environment of the inner pod and the environment of the lithography system, in general, and could damage the patterns on the mask or the blank substrate or block the EUV radiation causing fabrication errors. Translation, rotation, or rubbing between the mask or blank substrate in the inner pod with the particles may severely damage the mask or blank substrate. Damaged masks increase the production cost, increase manufacturing time, and require expensive systems for checking the defects in the mask.

The need for protection from particulate matter contaminating objects of interest (e.g., the mask) is required in many fields of application, including applications in semiconductor manufacturing such as extreme ultraviolet lithography. A lithographic apparatus projects a pattern from a patterning device (e.g., a photo mask) onto a layer of radiation-sensitive material (resist) provided on the semiconductor substrate. The wavelength of radiation used by a lithographic apparatus to project a pattern onto a substrate determines the minimum size of features that can be formed on that substrate. A lithographic apparatus that uses extreme ultraviolet radiation, being electromagnetic radiation having a wavelength within the range 4-20 nm, may be used to form smaller features on a substrate than a conventional lithographic apparatus (which may for example use electromagnetic radiation with a wavelength of 193 nm).

The patterning device (photo mask or reticle) is protected from particle contamination by a pellicle. While the pellicle limits contaminants from reaching the printed or patterned surface of reticle, particles (contaminants) generated due to friction between the inner pod cover and the inner pod base can still enter the EUV mask pod environment. These particles may travel out of the EUV mask pod and be dispersed in the lithography system and contaminate the environment of the lithography system and introduce defects into the pattern projected on the semiconductor substrate. It is desirable to limit generation of these contaminants. It should be noted that, although embodiments are discussed herein with reference to EUV lithography systems, embodiments are not limited in this regard. The mask pod, according to embodiments discussed herein, can be used in other types of lithography systems (e.g., deep ultraviolet (DUV) lithography systems), without departing from the scope of the disclosure.

FIG. 1A is a schematic and diagrammatic view of an EUV lithography system 101. The EUV lithography system 101 includes an EUV radiation source apparatus 100 to generate EUV light, an exposure tool 200, such as a scanner, and an excitation laser source apparatus 300. As shown in FIG. 1A, in some embodiments, the EUV radiation source apparatus 100 and the exposure tool 200 are installed on a main floor MF of a clean room, while the excitation source apparatus 300 is installed in a base floor BF located under the main floor. Each of the EUV radiation source apparatus 100 and the exposure tool 200 are placed over pedestal plates PP1 and PP2 via dampers DP1 and DP2, respectively. The EUV radiation source apparatus 100 and the exposure tool 200 are coupled to each other by a coupling mechanism, which may include a focusing unit.

The lithography system is an extreme ultraviolet (EUV) lithography system designed to expose a resist layer by EUV light (or EUV radiation). The resist layer is a material sensitive to the EUV light. The EUV lithography system employs the EUV radiation source apparatus 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure tool 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a-low pressure environment to avoid EUV intensity loss.

Figure 1B:
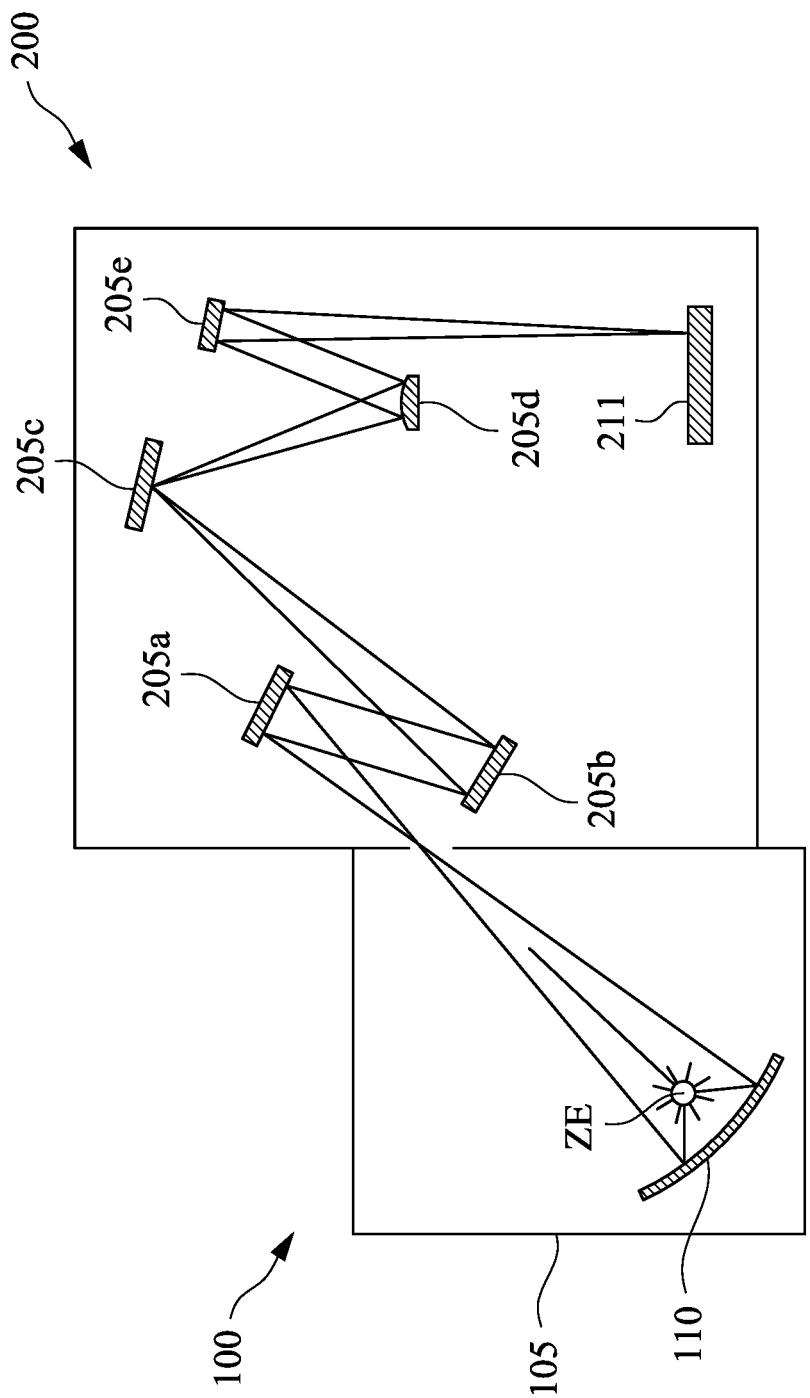
FIG. 1B is a schematic view of an EUV lithography system exposure tool according to embodiments of the disclosure.

FIG. 1B is a simplified schematic diagram of the exposure tool 200 according to an embodiment of the disclosure showing the exposure of photoresist coated substrate 211 with a patterned beam of EUV light. The exposure tool 200 is an integrated circuit lithography tool such as a stepper, scanner, step and scan system, direct write system, device using a contact and/or proximity mask, etc., provided with one or more optics 205a, 205b, for example, to illuminate a patterning optic, such as a reticle 205c, with a beam of EUV light, to produce a patterned beam, and one or more reduction projection optics 205d, 205e, for projecting the patterned beam onto the substrate 211. The one or more optics 205a, 205b provide the beam of EUV light with a desired cross-sectional shape and a desired angular distribution. The reticle 205c is protected by a pellicle, which is held in place by a pellicle frame. The reticle 205c reflects and patterns the beam of EUV light.

Figure 1C:
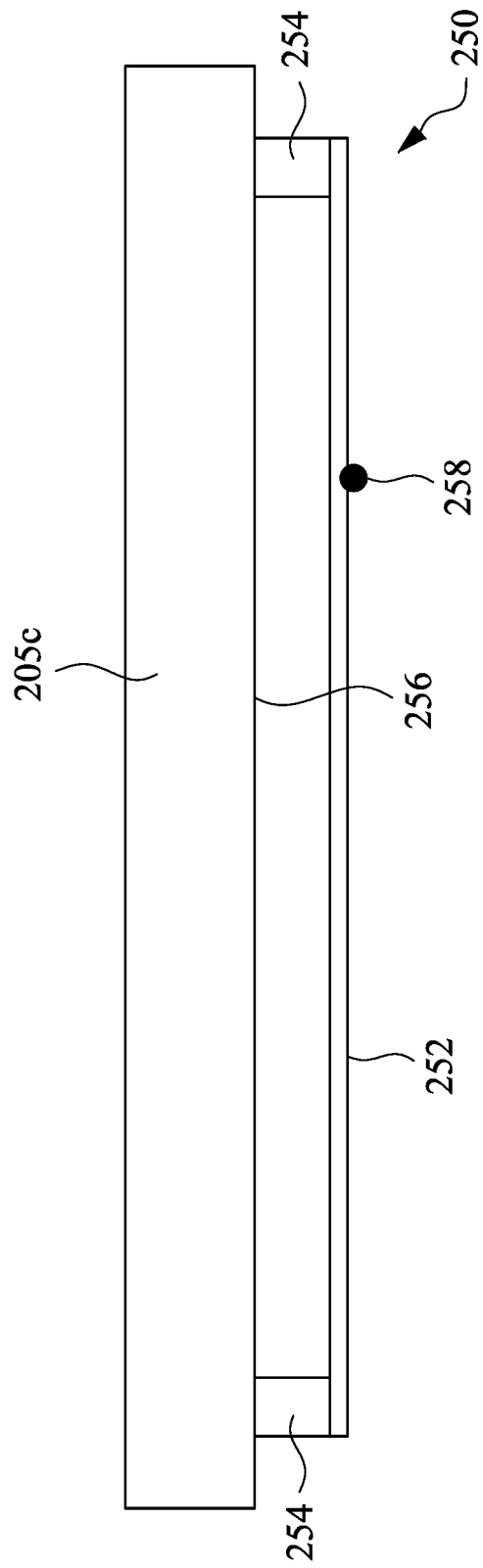
FIG. 1C illustrates a schematic pellicle assembly installed on a reticle placed in the EUV lithography system of FIG. 1A.

Referring briefly to FIG. 1C, illustrated is a schematic pellicle assembly 250 installed on the reticle 205c in relative detail. The pellicle assembly 250 includes a pellicle 252 and the pellicle frame 254. The reticle 205c has a patterned surface 256. The pellicle frame 254 supports the pellicle 252 around a perimeter portion of the pellicle 252 and is removably attachable to the reticle 205c.

The pellicle 252 holds a contaminant, e.g., contamination particle 258, at a distance from the patterned surface 256 of the reticle 205c such that the contamination particle 258 is not in the focal plane of the beam of EUV radiation and is thus not imaged onto the substrate 211 (FIG. 1B).

Returning to FIG. 1B, following reflection from the reticle the patterned beam of EUV light is provided to the one or more optics 205a, 205b and is in turn projected onto the substrate 211 held by a mechanical assembly (e.g., substrate table). In some embodiments, the one or more optics 205a, 205b apply a reduction factor to the radiation beam, forming an image with features that are smaller than corresponding features on the reticle. The mechanical assembly may be provided for generating a controlled relative movement between the substrate 211 and reticle 205c.

The EUV lithography system may, for example, be used in a scan mode, wherein the chuck and the mechanical assembly (e.g., substrate table) are scanned synchronously while a pattern imparted to the radiation beam is projected onto the substrate 211 (i.e. a dynamic exposure). The velocity and direction of the substrate table relative to the chuck is determined by the demagnification and image reversal characteristics of the exposure tool 200. The patterned beam of EUV radiation that is incident upon the substrate 211 comprises a band of radiation. The band of radiation is referred to as an exposure slit. During a scanning exposure, the movement of the substrate table and the chuck is such that the exposure slit travels over an exposure field of the substrate 211. As further shown in FIG. 1B, the EUVL tool includes an EUV radiation source 100 including plasma at ZE emitting EUV light in a chamber 105 that is collected and reflected by a collector 110 along a path into the exposure tool 200 to irradiate the substrate 211.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gratings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic," as used herein, is not meant to be limited to components which operate solely within one or more specific wavelength range(s) such as at the EUV output light wavelength, the irradiation laser wavelength, a wavelength suitable for metrology or any other specific wavelength.

In the present disclosure, the terms mask, photomask, and reticle are used interchangeably. In the present embodiment, the mask is a reflective mask. One exemplary structure of the mask includes a substrate with a suitable material, such as a low thermal expansion material or fused quartz. In various examples, the material includes $TiO_2$ doped $SiO_2$, or other suitable materials with low thermal expansion. The mask includes multiple reflective multiple layers deposited on the substrate. The multiple layers include a plurality of film pairs, such as molybdenum-silicon (Mo/Si) film pairs (e.g., a layer of molybdenum above or below a layer of silicon in each film pair). Alternatively, the multiple layers may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the multiple layers. The absorption layer is patterned to define a layer of an integrated circuit (IC). Alternatively, another reflective layer may be deposited over the multiple layers and is patterned to define a layer of an integrated circuit, thereby forming an EUV phase shift mask.

In the present embodiments, the semiconductor substrate is a semiconductor wafer, such as a silicon wafer or other type of wafer to be patterned. The semiconductor substrate is coated with a resist layer sensitive to the EUV light in the present embodiment. Various components including those described above are integrated together and are operable to perform lithography exposing processes.

The lithography system may further include other modules or be integrated with (or be coupled with) other modules. As shown in FIG. 1A, the EUV radiation source 100 includes a target droplet generator 115 and a LPP collector 110, enclosed by a chamber 105. The target droplet generator 115 generates a plurality of target droplets DP. In some embodiments, the target droplets DP are tin (Sn) droplets. In some embodiments, the tin droplets each have a diameter about 30 microns (μm). In some embodiments, the tin droplets DP are generated at a rate about 50 droplets per second and are introduced into a zone of excitation ZE at a speed about 70 meters per second (m/s). Other material can also be used for the target droplets, for example, a tin containing liquid material such as eutectic alloy containing tin or lithium (Li).

The excitation laser LR2 generated by the excitation laser source apparatus 300 is a pulse laser. In some embodiments, the excitation layer includes a pre-heat laser and a main laser. The pre-heat laser pulse is used to heat (or pre-heat) the target droplet to create a low-density target plume, which is subsequently heated (or reheated) by the main laser pulse, generating increased emission of EUV light. In various embodiments, the pre-heat laser pulses have a spot size about 100 μm or less, and the main laser pulses have a spot size about 200-300 μm.

The laser pulses LR2 are generated by the excitation laser source 300. The laser source 300 may include a laser generator 310, laser guide optics 320 and a focusing apparatus 330. In some embodiments, the laser generator 310 includes a carbon dioxide (CO2) or a neodymium-doped yttrium aluminum garnet (Nd:YAG) laser source. The laser light LR1 generated by the laser generator 300 is guided by the laser guide optics 320 and focused into the excitation laser LR2 by the focusing apparatus 330, and then introduced into the EUV radiation source 100.

The laser light LR2 is directed through windows (or lenses) into the zone of excitation ZE. The windows adopt a suitable material substantially transparent to the laser beams. The generation of the pulse lasers is synchronized with the generation of the target droplets. As the target droplets move through the excitation zone, the pre-pulses heat the target droplets and transform them into low-density target plumes. A delay between the pre-pulse and the main pulse is controlled to allow the target plume to form and to expand to an optimal size and geometry. When the main pulse heats the target plume, a high-temperature plasma is generated. The plasma emits EUV radiation EUV, which is collected by the collector mirror 110. The collector 110 has a reflection surface that reflects and focuses the EUV radiation for the lithography exposing processes. In some embodiments, a droplet catcher 120 is installed opposite the target droplet generator 115. The droplet catcher 120 is used for catching excess target droplets. For example, some target droplets may be purposely missed by the laser pulses.

The collector 110 includes a proper coating material and shape to function as a mirror for EUV collection, reflection, and focusing. In some embodiments, the collector 110 is designed to have an ellipsoidal geometry. In some embodiments, the coating material of the collector 110 is similar to the reflective multilayer of the EUV mask. In some examples, the coating material of the collector 110 includes multiple layers (such as a plurality of Mo/Si film pairs) and may further include a capping layer (such as Ru) coated on the multiple layers to substantially reflect the EUV light. In some embodiments, the collector 110 may further include a grating structure designed to effectively scatter the laser beam directed onto the collector 110. For example, a silicon nitride layer is coated on the collector 110 and is patterned to have a grating pattern in some embodiments.

In such an EUV radiation source apparatus, the plasma caused by the laser application creates physical debris, such as ions, gases and atoms of the droplet, as well as the desired EUV radiation. It is necessary to prevent the accumulation of material on the collector 110 and also to prevent physical debris exiting the chamber 105 and entering the exposure tool 200.

As shown in FIG. 1A, in some embodiments, a buffer gas is supplied from a first buffer gas supply 130 through the aperture in collector 110 by which the pulse laser is delivered to the tin droplets. In some embodiments, the buffer gas is $H_2$, He, Ar, $N_2$, or another inert gas. In certain embodiments, $H_2$ is used as H radicals generated by ionization of the buffer gas can be used for cleaning purposes. The buffer gas can also be provided through one or more second buffer gas supplies 135 toward the collector 110 and/or around the edges of the collector 110. Further, the chamber 105 includes one or more gas outlets 140 so that the buffer gas is exhausted outside the chamber 105.

Hydrogen gas has low absorption to the EUV radiation. Hydrogen gas reaching to the coating surface of the collector 110 reacts chemically with a metal of the droplet forming a hydride, e.g., metal hydride. When tin (Sn) is used as the droplet, stannane $SnH_4$, which is a gaseous byproduct of the EUV generation process, is formed. The gaseous $SnH_4$ is then pumped out through the outlet 140. However, it is difficult to exhaust all gaseous $SnH_4$ from the chamber and to prevent the $SnH_4$ from entering the exposure tool 200.

To trap the $SnH_4$ or other debris, one or more debris collection mechanisms or devices 150 are employed in the chamber 105. As shown in FIG. 1A, one or more debris collection mechanisms or devices 150 are disposed along optical axis A1 between the zone of excitation ZE and an output port 160 of the EUV radiation source 100.

Figure 2:
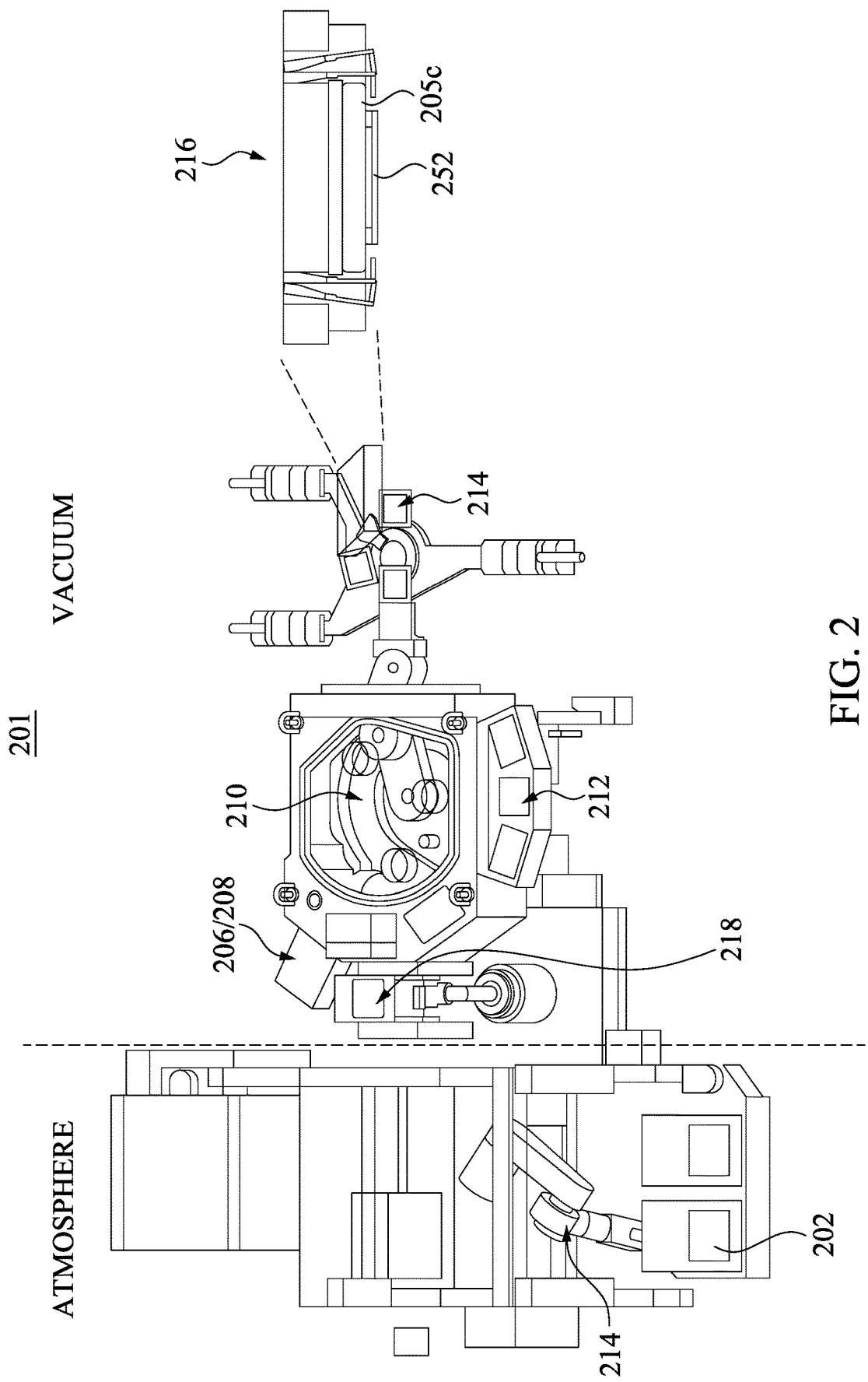
FIG. 2 illustrates a top view of a layout of different stages (or stations) with an extreme ultraviolet lithography system.

FIG. 2 illustrates a layout of different stages (or stations) of a reticle handling system 201, according to embodiments. In some embodiments, the reticle handling system 201 is used in an extreme ultraviolet (EUV) lithography system. The reticle handling system 201 is used in conjunction with the exposure tool 200 (FIG. 1B) for receiving and storing a reticle 205c that is then provided to the exposure tool 200 for exposing to a beam of EUV radiation. As illustrated, the reticle handling system 201 includes a load port 202, an out of vacuum robot (OVR) 204, a reticle backside inspection (RBI) stage 206, a barcode reader 208, an in-vacuum robot (IVR) 210, an in-vacuum library (IVL) 212, a rapid exchange device (RED) 214, and a reticle stage (RS) 216 (e.g., including the reticle 205c). The load port 202 and the out of vacuum robot (OVR) 204 are located in an atmospheric pressure environment while the reticle backside inspection (RBI) stage 206, the barcode reader 208, the in-vacuum robot (IVR) 210, the in-vacuum library (IVL) 212, the rapid exchange device (RED) 214, and the reticle stage (RS) 216 are located in a vacuum environment. Access between the vacuum environment and the atmospheric pressure environment is controlled by a load lock chamber 218. For instance, the load lock chamber 218 is located between the out of vacuum robot (OVR) 204 and the in-vacuum library (IVL) 212.

The load port 202 serves as an entry point to the reticle handling system 201 via which a reticle (e.g., reticle 205c in FIG. 1) is introduced into the reticle handling system 201. In an embodiment, the reticle 205c including the pellicle 252 is enclosed within a clean filter pod (CFP) which in turn is enclosed in a reticle carrier, also known as a reticle standard manufacturing interface ("SMIF") pod, or RSP. The reticle standard manufacturing interface pod permits handling and transportation of the reticle 205c outside of the reticle handling system 201, for example, in an ambient environment. The reticle standard manufacturing interface pod is shaped and sized (or otherwise configured) to be received into the load port 202.

In some embodiments, adjacent to the load port 202 is a RSP library. In some embodiments, reticle standard manufacturing interface pod is placed by load port 202 into RSP library. The RSP library is a repository or storage for multiple reticle standard manufacturing interface pods each including a reticle. When a particular reticle is required, the reticle standard manufacturing interface pod containing the required reticle is retrieved from the RSP library.

In some embodiments, the out of vacuum robot (OVR) 204 retrieves the reticle standard manufacturing interface pod containing the required reticle for providing the reticle to the load lock chamber 218. In some embodiments, the out of vacuum robot (OVR) 204 is also configured to open the reticle standard manufacturing interface pod and remove the clean filter pod including the reticle. A vacuum pump is connected to load lock chamber 218 and forms a vacuum environment inside load lock chamber 218. The load lock chamber 218 is sandwiched by two valves for controlling the pressure in the load lock chamber 218. The load lock chamber 218 provides an interface between the stages of the reticle handling system 201 in atmospheric pressure and the stages of the reticle handling system 201 in vacuum, such that an extreme ultraviolet lithography mask can be transferred between an atmospheric pressure condition and a vacuum condition.

The reticle backside inspection (RBI) stage 206 is located adjacent the load lock chamber 218 and includes the equipment to measure and clean the backside of the reticle 205c to limit the particles on the backside of the reticle 205c. In an embodiment, the reticle backside inspection (RBI) stage 206 includes one or more of an optical system for detecting particles on the backside of the reticle 205c, a measuring system for measuring size of the particles, a cleaning system for cleaning the backside of the reticle 205c, and an inspection system for inspecting the backside of the reticle 205c. The reticle 205c must be kept very flat when attached to chuck. Therefore, it is also important to prevent relatively large particles, (e.g., 1 µm), or layers of smaller particles from migrating to the backside of reticle 205c, which is the surface of the reticle 205c that contacts the chuck. Particles on the backside can distort the reticle 205c and cause focusing and overlay errors. The backside particles can also migrate to the support structure securing the reticle 205c during exposure and cause similar problems for all subsequent reticles that are handled by the support structure. The barcode reader 208 identifies the reticle 205c and the pattern formed thereon.

The in-vacuum robot (IVR) 210 is located adjacent the load lock chamber 218 and operates to transport the reticle 205c (or, as the case may be, the reticle standard manufacturing interface pod including clean filter pod, or the clean filter pod if removed by the out of vacuum robot 204) from the load lock chamber 218 to the in-vacuum library (IVL) 212 for temporarily storing the reticle 205c before use. In some embodiments, when the particular reticle is needed, the in-vacuum robot (IVR) 210 retrieves the desired reticle from the in-vacuum library (IVL) 212 and provides the reticle to the rapid exchange device (RED) 214. In some other embodiments, the rapid exchange device (RED) 214 retrieves the desired reticle from the in-vacuum library (IVL) 212.

During manufacture of integrated circuits using a lithographic apparatus, different reticles are used to generate different circuit patterns to be formed on different layers in the integrated circuit. Thus, during the manufacturing different reticles of the integrated circuit the different reticles must be changed. The rapid exchange device (RED) 214 (also referred to as a reticle exchange device) is used to change reticles during the lithography process in the least possible amount of time.

The reticle stage 216 includes a support structure, which, for example, is a chuck, for securing the reticle 205c in place during the lithography process. The pellicle 252 is positioned over the reticle 205c to protect the reticle 205c from particles, dust, damage and/or contamination.

FIG. 3A is an exploded view of a perspective view of a reticle pod 350. FIG. 3B is a schematic cross-sectional view of the reticle pod 350. A reticle (e.g., reticle 205c) is stored, transported, and loaded into a lithography system by the reticle pod, e.g., a SMIF pod, 350. The reticle pod 350 is a container including two pods, one inside the other, which protect the reticle from contamination. The reticle pod 350 has an outer pod that encases an inner pod. The inner pod holds the reticle directly. The dual pod including the reticle is provided to the reticle handling system 201 (FIG. 2). When received, the reticle handling system 201 initially opens the outer pod to retrieve the inner pod including the reticle. The inner pod containing the reticle is temporarily stored until the reticle is required for use.

As illustrated, the reticle 205c is stored in an inner pod 354. The inner pod 354 includes an inner pod base 356 and an inner pod cover 355. The reticle 205c is stored face down in the inner pod 354. More specifically, the printed or patterned surface 365 (also referred to as the front face) of reticle 205c faces the inner pod base 356 and the backside surface 367 of reticle 205c faces the inner pod cover 355. For the sake of clarity of illustration, the pellicle is not shown over the patterned surface 365. However, it should be noted that a pellicle (e.g., pellicle 252) is installed on the reticle 205c within one or more restraining mechanisms 361. The inner pod base 356 includes the one or more restraining mechanisms 361 to reduce sliding or movement of the reticle 205c and thereby secure the reticle 205c in the inner pod 354. Alternatively, or additionally, the inner pod cover 355 includes one or more restraining mechanisms 361 to secure the reticle 205c in place. By way of example, restraining mechanisms 361 include a clamp, a groove, a pin, a fixation block, and a spring. The inner pod cover 355 couples to the inner pod base 356 to define an internal space 311 or internal environment of the reticle pod 350. The reticle 205c is located in the internal space 311 between the inner pod base 356 and inner pod cover 355.

Referring to FIG. 3B, the inner pod cover 355 includes a generally horizontal top portion 380 and a side portion 382 extending generally vertically from the top portion 380 and forming the edge (sidewall) or the rim of the top portion 380. As illustrated, the side portion 382 has a horizontal (or radial) width W and a surface 371 forms the lower surface (or at least a portion thereof) of the side portion 382 of the inner pod cover 355. Surface 373 forms the upper surface (or at least a portion thereof) of the inner pod base 356. When the inner pod cover 355 is positioned over the inner pod base 356, the surface 371 and surface 373 face each other. When the inner pod cover 355 is placed on the inner pod base 356, the surface 371 and the surface 373 contact each other.

In some embodiments, the inner pod cover 355 and inner pod base 356 are made of nickel coated aluminum alloy. In some embodiments, the nickel coating is Ni-P or Ni-Cr. The Ni-P or Ni-Cr particles may be generated by friction in locations where the inner pod cover 355 and inner pod base 356 come into contact. If the friction-generated particles fall on the reticle 205c on the inner pod base 356, the particles can cause masking image errors when the reticle 205c is used for photolithography.

The inner pod 354 is securely contained in an outer pod 351. In some embodiments, the outer pod is a reticle standard manufacturing interface ("SMIF") pod (RSP). The outer pod 351 includes an outer base 353 and an outer cover 352. Similar to the inner pod cover 355 and the inner pod base 356, the outer base 353 couples to the outer cover 352, effectively sandwiching the inner pod 354 between the outer base 353 and the outer cover 352. The inner pod 354 rests securely on the outer base 353 with the outer cover 352 closed with outer base 353.

The inner and outer pods 354, 351 are designed in a manner that facilitates their opening, closing, and general manipulation. For example, the inner and outer pods 354, 351 are designed to include robotic handling flanges, latch-pin holes, pins, conveyor rails, end effector exclusion volumes, secondary and primary side robotic handling flanges, features for reticle alignment and data matrix identification, registration pin features, features which mate with kinematic-coupling pins, and the like.

Embodiments of the disclosure are directed to an inner pod including a coating on the surfaces of the inner pod cover and the inner pod base. The coating limits the friction between the inner pod cover and the inner pod base. As a result, peeling of the surfaces of the inner pod cover and the inner pod base is minimized and the particles generated are reduced.

Figure 4A:
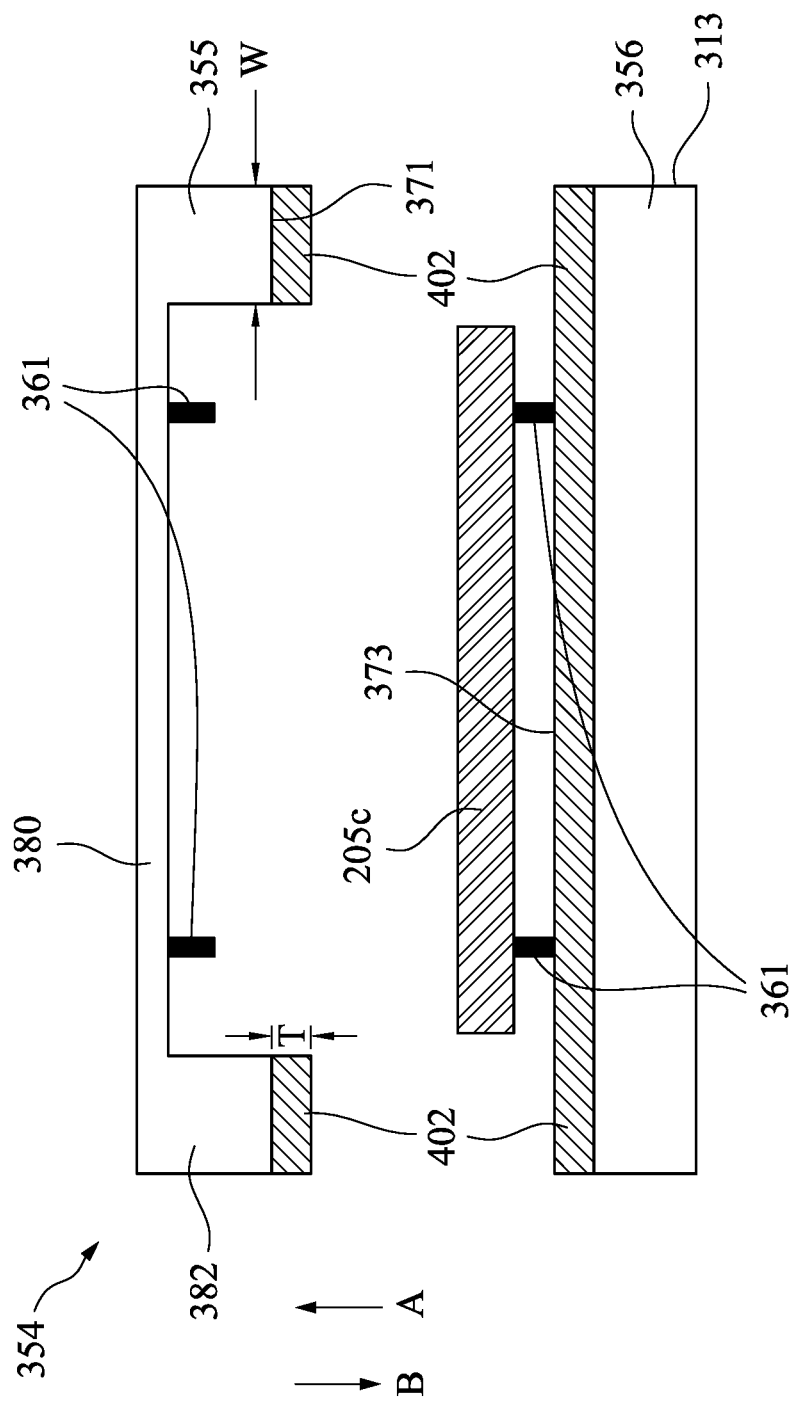
FIG. 4A is a schematic diagram illustrating the inner pod including a layer of coating material, according to embodiments of the disclosure

FIG. 4A is a schematic diagram illustrating the inner pod 354 including a layer 402 of coating material, according to embodiments of the disclosure. For the purpose of illustration, the inner pod cover 355 and the inner pod base 356 are shown separated from each other.

The inner pod cover 355 and the inner pod base 356 are made of metal materials such as aluminum alloy for weight control. The aluminum alloy, for example, aluminum-magnesium (Al-Mg) alloy, has poor mechanical properties and can be damaged easily. To improve the mechanical properties, the inner pod cover 355 and the inner pod base 356 are partially or fully coated with a harder material than the aluminum alloy, for example, a nickel coating including Ni-P or Ni-Cr. In other instances, the inner pod cover 355 and the inner pod base 356 are coated with chromium (Cr).

The Ni-P or Ni-Cr particles can be generated by friction where the inner pod cover 355 and inner pod base 356 come into contact. If the friction-generated particles fall on the reticle 205c on the inner pod base 356, the particles can cause masking image errors when the mask is used for photolithography.

To limit the formation of particles generated by friction and to prevent the image error in the nanometer-scaled mask pattern, the surfaces 371 and 373 (including Ni, Ni-P or Cr) of the inner pod cover 355 and inner pod base 356 are coated with a softer, flexible material than the Ni coating, for example, a layer 402 of elastomer, in some embodiments. In other embodiments, the layer 402 includes a gelatinous material or a sponge type material. Elastomers and gelatinous materials have flexibility and elasticity. These materials can be stretched easily, but return to their original shapes when the force or stress is removed. Thus, the layers 402 limit the generation of particles when the surfaces 371 and 373 of the inner pod cover 355 and the inner pod base 356 contact each other. Examples of elastomers include natural rubbers, styrene-butadiene block copolymers, polyisoprene, polybutadiene, ethylene propylene rubber, ethylene propylene diene rubber, silicone elastomers, fluoroelastomers, polyurethane elastomers, and nitrile rubbers. However, other types of the elastomers that are soft and flexible are also within the scope of the disclosure. In some embodiments, gelatinous materials include gelatin.

In embodiments, the layers 402 on the inner pod base 356 and the inner pod cover 355 are made of the same elastomer or gelatinous material. In other embodiments, the layers 402 on the inner pod base 356 and the inner pod cover 355 are made of different elastomer or gelatinous materials.

Figure 4C:
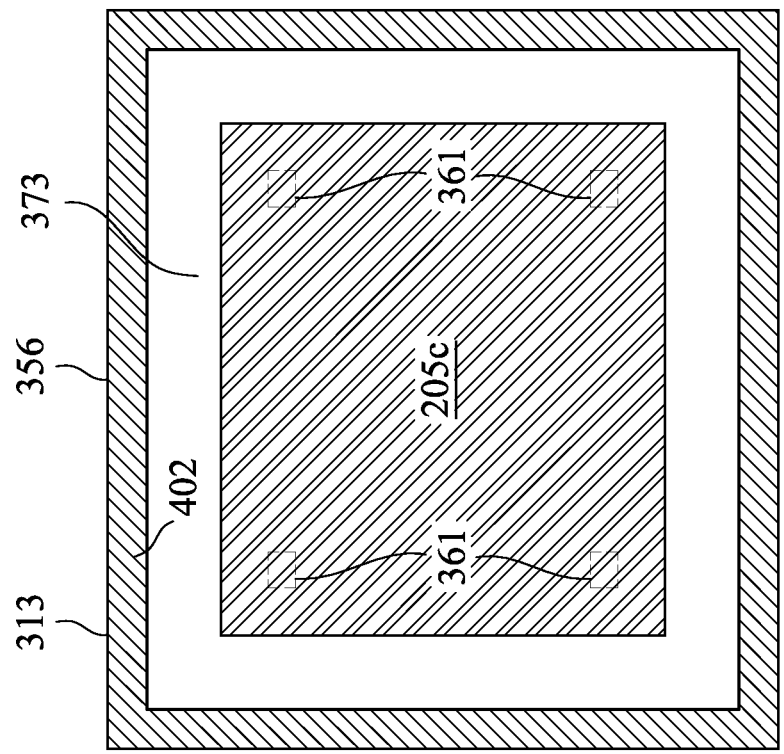
FIG. 4C illustrates a plan view of the inner pod base in the direction of the arrow B in FIG. 4A
Figure 4B:
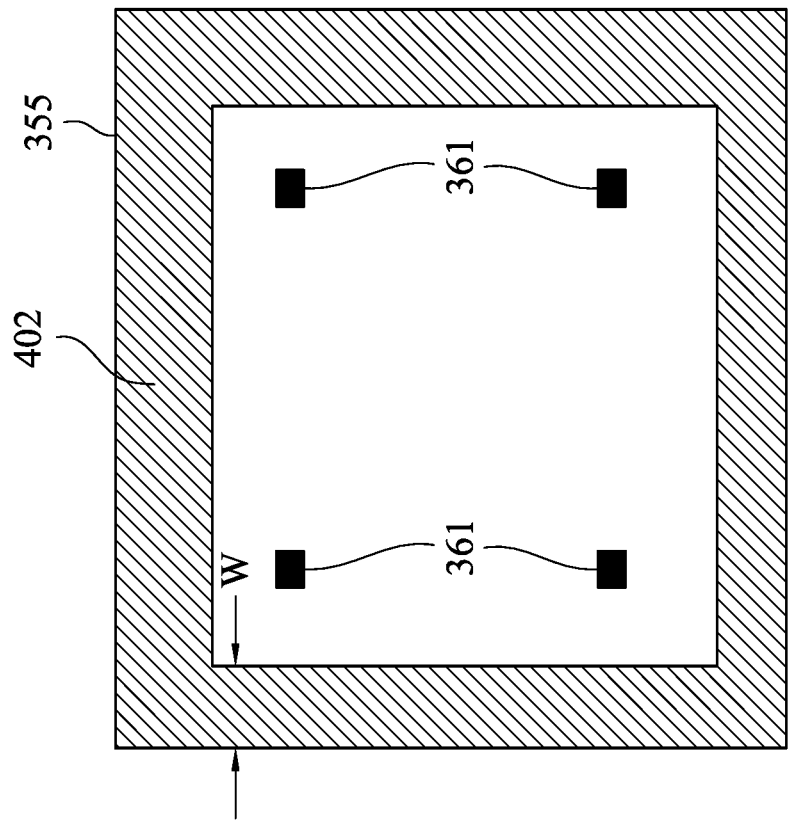
FIG. 4B illustrates a view of the inner pod cover in the direction of the arrow A in FIG. 4A.

FIG. 4B illustrates a view of the inner pod cover 355 in the direction of the arrow A in FIG. 4A. FIG. 4C illustrates a plan view of the inner pod base 356 in the direction of the arrow B in FIG. 4A. In some embodiments, and as illustrated in FIGS. 4A and 4B, the layer 402 is coated on the surface 371 and forms the periphery of the inner pod cover 355. As illustrated in FIGS. 4A and 4C, the layer 402 is also coated on the surface 373 along the peripheral region of the inner pod base 356. As illustrated, the layer 402 on the surface 373 is flush with the outer edge 313 of the inner pod base 356. In some embodiments, the layer 402 on the surface 373 is spaced from the outer edge 313 of the inner pod base 356.

In some embodiments, instead of the entire peripheral region of the inner pod cover 355, the layer 402 is coated on only a portion of the peripheral region. The layer 402 is then coated on the surface 373 in portions along the peripheral region of the inner pod base 356 such that when the inner pod cover 355 is placed on the inner pod base 356, the internal space 311 is defined surrounded by layers 402. In other words, the layers 402 on the inner pod cover 355 and the inner pod base 356 complement each other.

Figure 4E:
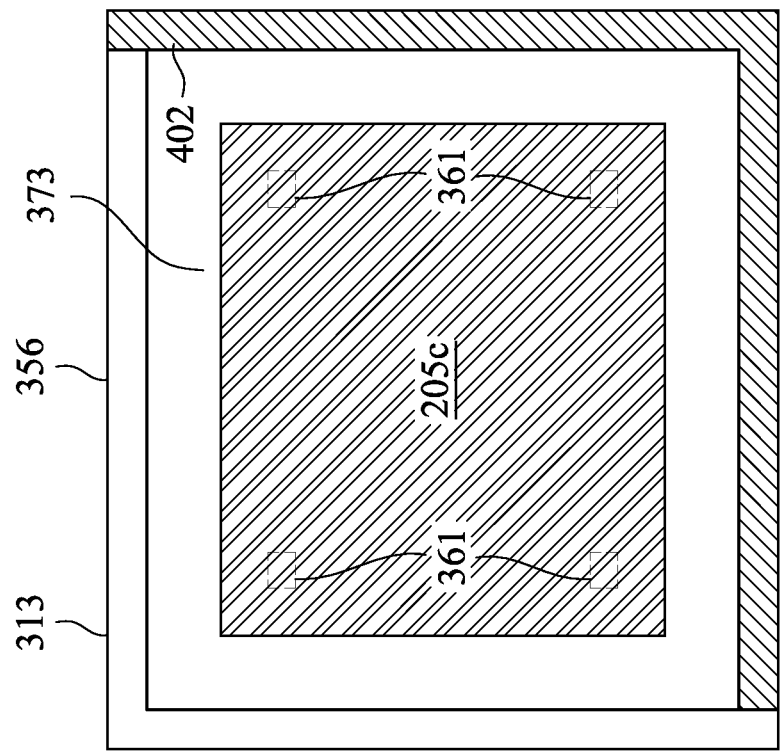
FIG. 4E illustrates a surface of the inner pod base including the layer along the bottom edge and right edge along the peripheral region.
Figure 4D:
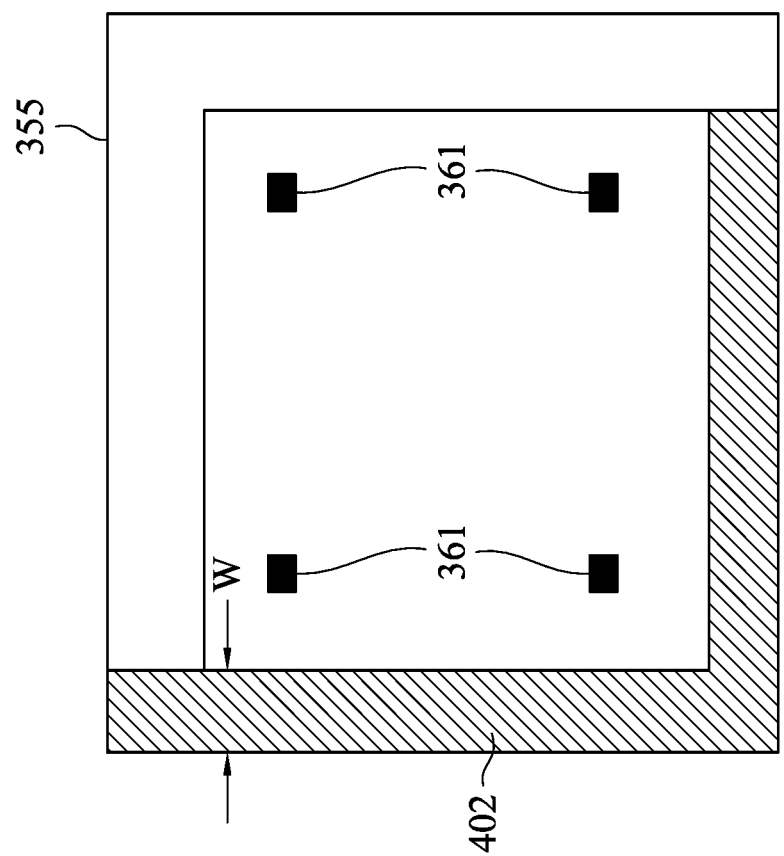
FIG. 4D illustrates a surface of the inner pod cover including the layer along the left edge and bottom edge along the peripheral region.

FIG. 4D illustrates the surface 371 of the inner pod cover 355 including the layer 402 along the left edge and bottom edge along the peripheral region. FIG. 4E illustrates the surface 373 of the inner pod base 356 including the layer 402 along the bottom edge and right edge along the peripheral region. Thus, referring to orientation of the inner pod cover 355 and the inner pod base 356 in FIG. 4A, the layers 402 on the inner pod cover 355 and the inner pod base 356 complement each other, and when the inner pod cover 355 is placed on the inner pod base 356, the layers 402 cooperatively define the internal space 311 that encloses the reticle 205c.

Figure 4G:
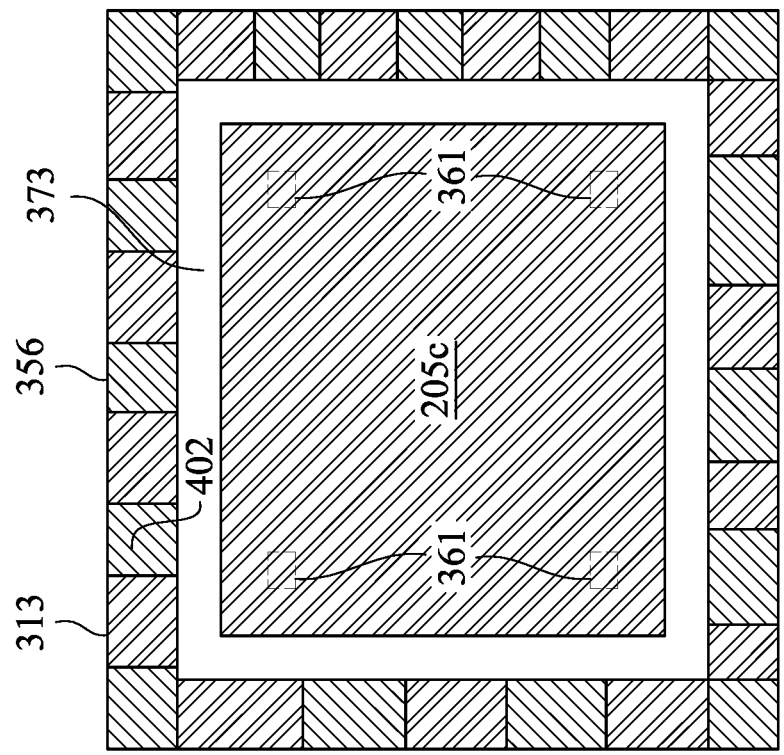
FIG. 4G illustrates a surface of the inner pod base including the layer disposed at multiple discrete locations along the peripheral region of the inner pod base.
Figure 4F:
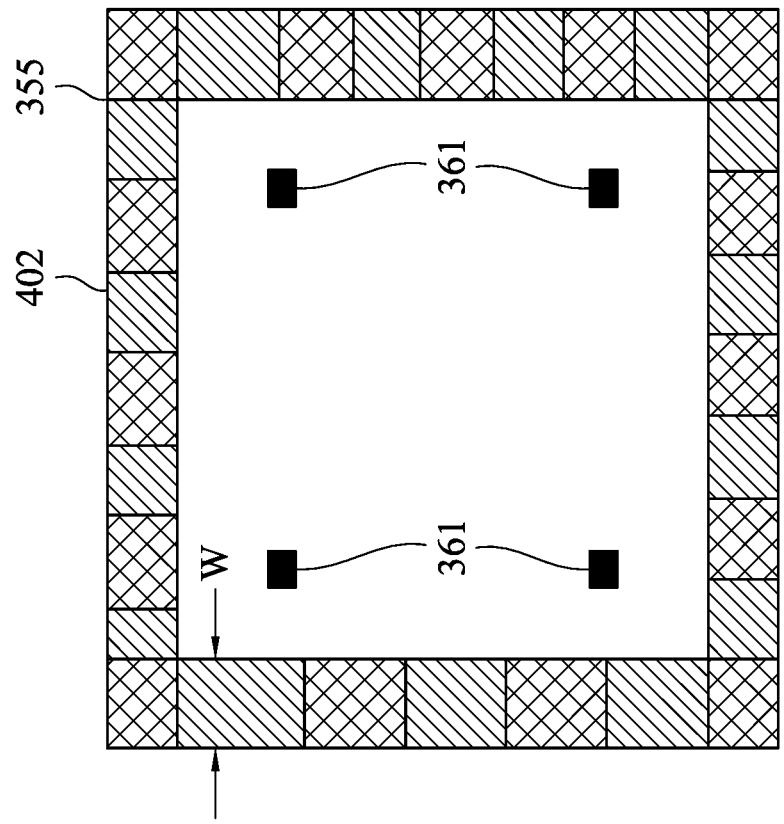
FIG. 4F illustrates a surface of the inner pod cover including the layer disposed at multiple discrete locations along the peripheral region the inner pod cover.

FIG. 4F illustrates the surface 371 of the inner pod cover 355 including the layer 402 disposed at multiple discrete locations along the peripheral region the inner pod cover 355. FIG. 4G illustrates the surface 373 of the inner pod base 356 including the layer 402 disposed at multiple discrete locations along the peripheral region of the inner pod base 356. Thus, the layers 402 form an interleaving/interlocking pattern. When the inner pod cover 355 is placed on the inner pod base 356, each layer 402 in the inner pod over 355 are received within adjacent the layers 402 on the inner pod base 356. Thus, referring to orientation of the inner pod cover 355 and the inner pod base 356 in FIG. 4A, when the inner pod cover 355 is placed on the inner pod base 356, the layers 402 cooperatively define the internal space 311 that encloses the reticle 205c.

In FIGS. 4A and 4B, the layer 402 is illustrated extending the entire width W of the surface 371. However, in other embodiments, the layer 402 extends less than the width W of the surface 371.

Figure 4H:
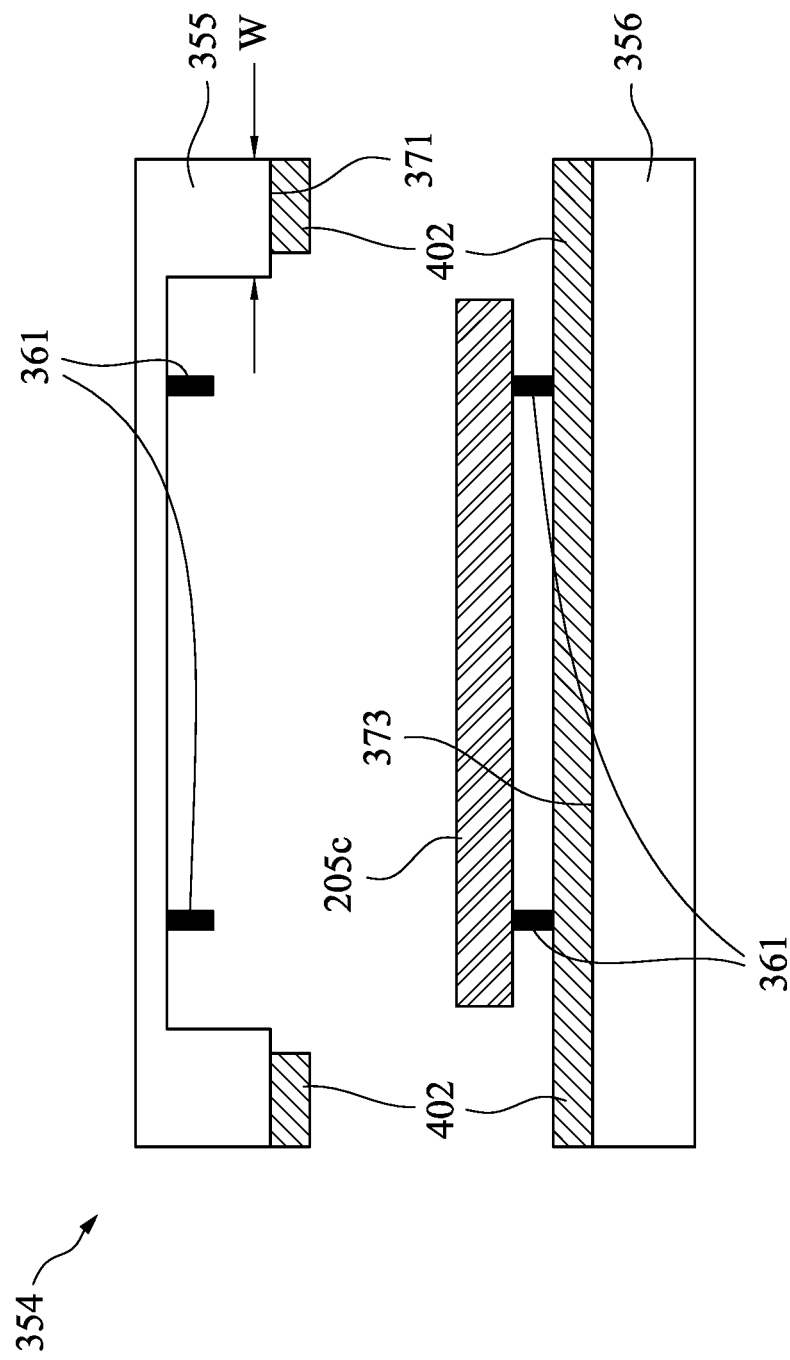
FIG. 4H is a schematic diagram illustrating the layer extending less than the width of the cover, according to embodiments of the disclosure

FIG. 4H is a schematic diagram illustrating the layer 402 extending less than the width W of the surface 371, according to embodiments of the disclosure.

In some embodiments, the layers 402 are removably attached to the surfaces of the inner pod cover 355 and the inner pod base 356. Thus, it is easy to replace the layers 402, for instance, in case of damage or when layer 402 of a different material is to be installed on the surfaces. The layer 402 can be applied as a spin-on coat. In some embodiments, the thickness T (FIG. 4A) of the layer 402 is in the range of around 100 nm to around 5 μm and is in the range of around 500 nm to around 1 μm in other embodiments. In some embodiments, the thickness of the layer 402 on the inner pod cover 355 and of the layer 402 on the inner pod base 356 is the same. In other embodiments, the thicknesses are different. In some embodiments, the layer 402 on the inner pod cover 355 and the layer 402 on the inner pod base 356 having complementing thickness profiles. For instance, referring to FIG. 4A, the thickness of the layer 402 on the inner pod cover 355 decreases (e.g., a gradual thickness gradient) from the left end of the inner pod cover 355 to the right end of the inner pod cover 355. Thus, the layer 402 is the thickest at the left end and is the thinnest at the right end. In a complementary manner, the layer 402 on the inner pod base 356 is thickest at the right end and is the thinnest at the left end. Thus, when the inner pod cover 355 is placed on the inner pod base 356, the inner pod cover 355 is substantially leveled (horizontal).

When the thickness of the layer 402 is less than around 100 nm, the layer may be easily damaged due to movement of the inner pod cover 355 and the inner pod base 356. When the thickness of the layer 402 is greater than 5 μm, the layer 402 may be too stiff (less flexible) and there may be increased friction due to movement of the inner pod cover 355 and the inner pod base 356.

In some embodiments of the present disclosure, the elasticity or the gelatinousness of the layer 402 is selected to allow the inner pod cover 355 and the inner pod base 356 to smoothly slide over each other. As a result, friction between the inner pod cover 355 and the inner pod base 356 is reduced.

Figure 4I:
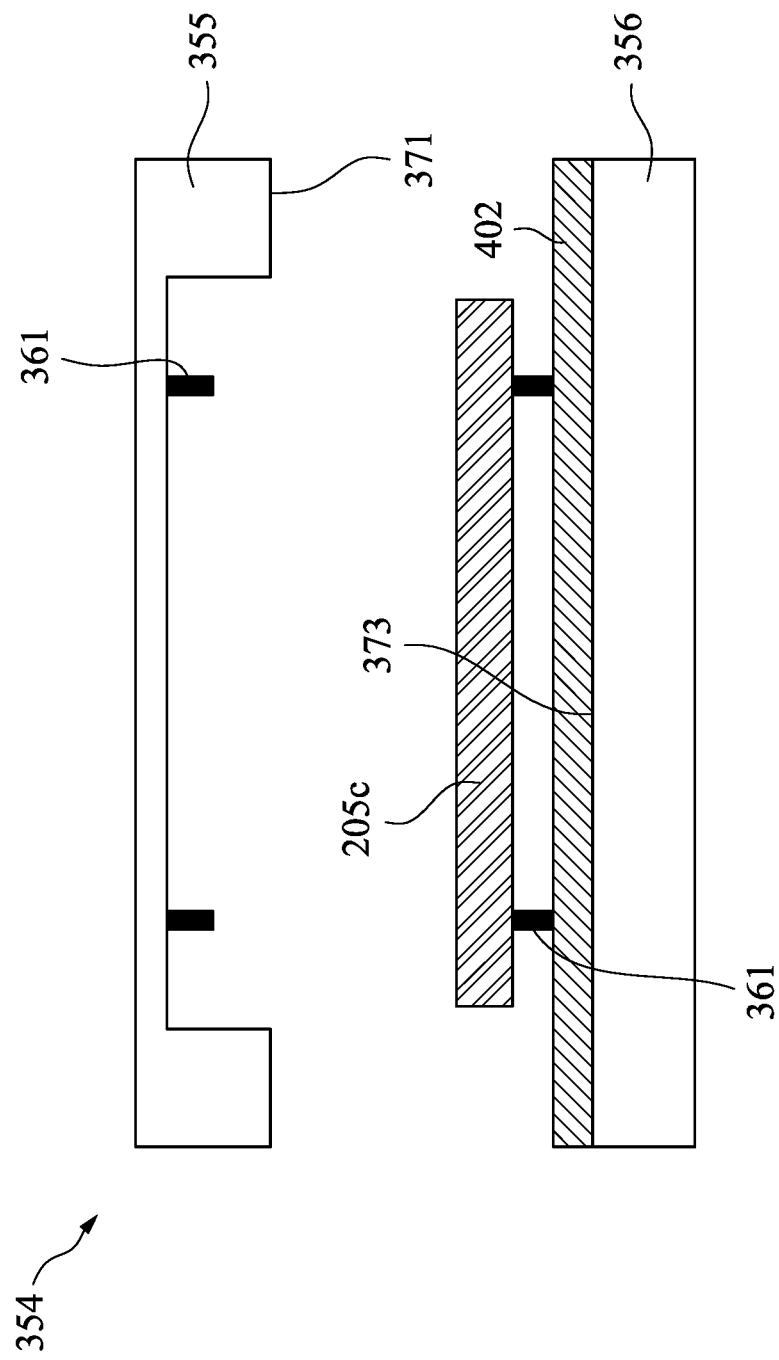
FIG. 4I illustrates only a surface of the inner pod base being coated with the layer, according to embodiments of the disclosure.
Figure 4J:
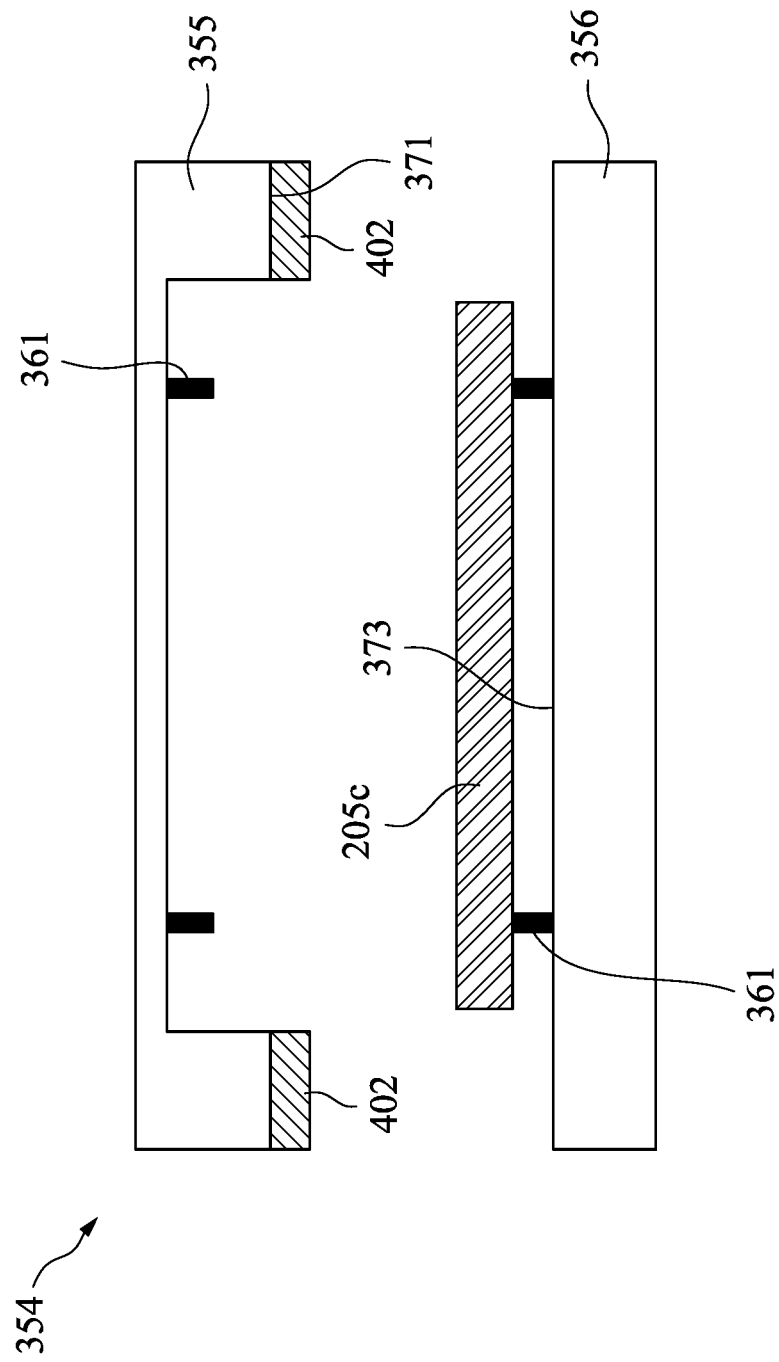
FIG. 4J illustrates only a surface of the inner pod cover being coated with the layer, according to embodiments of the disclosure.

In some embodiments, and as illustrated in FIG. 4I, only the surface 373 of the inner pod base 356 is coated with the layer 402 and the layer 402 is absent from the inner pod cover 355. In some embodiments, and as illustrated in FIG. 4J, only the surface 371 of the inner pod cover 355 is coated with the layer 402 and the layer 402 is absent from the inner pod base 356.

Figure 5:
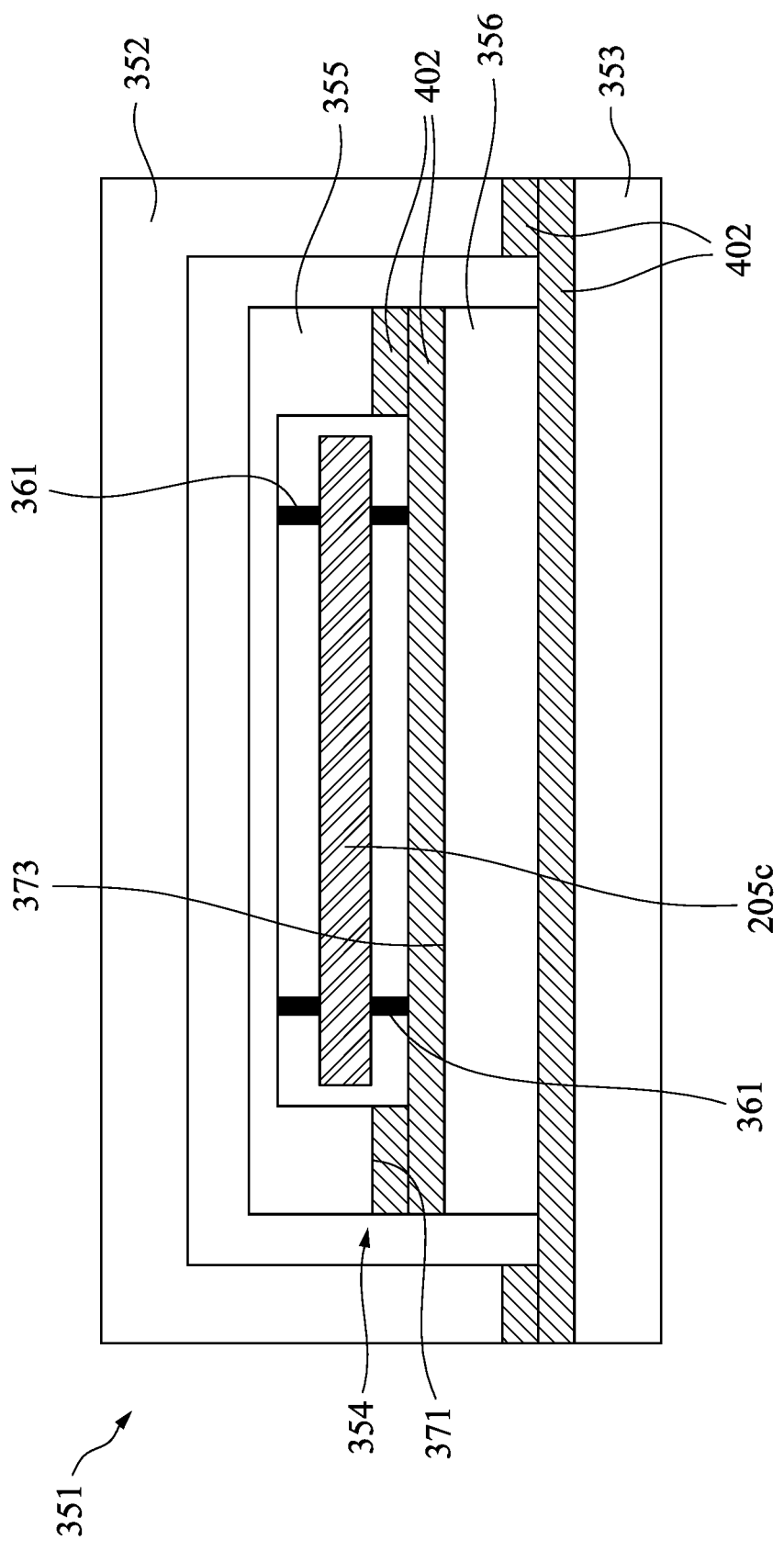
FIG. 5 illustrates the surfaces of the outer base and the outer cover of the outer pod coated with the layer, according to embodiments of the disclosure.

In some other embodiments, in addition to the inner pod cover 355 and/or the inner pod base 356, the surfaces of the outer base 353 and/or the outer cover 352 of the outer pod 351 that contact each other when the outer cover 352 in placed on the outer base 353 are coated with the layer 402 of coating material. FIG. 5 illustrates the surfaces of the outer base 353 and the outer cover 352 of the outer pod 351 coated with the layer 402. In some other embodiments, only the surface of the outer base 353 or only the surface of the outer cover 352, not both, are coated with the layer 402. It should be noted that, in other embodiments, the layer 402 on the surfaces of the outer pod 351 and the layer 402 on the surfaces of the inner pod 354 include different materials. In other embodiments, the layers 402 on the surfaces of the outer pod 351 and the surfaces of the inner pod 354 include the same material.

It should be noted that, although embodiments disclose a single layer 402 disposed on the surfaces of the inner pod 354 and the outer pod 351, embodiments are not limited thereto, and other embodiments include a plurality of layers 402 disposed on the surfaces. For instance, the plurality of layer 402 can include multiples layers 402 stacked over each other. The multiple layers 402 can include layers of the same material or layers of different materials.

Figure 6:
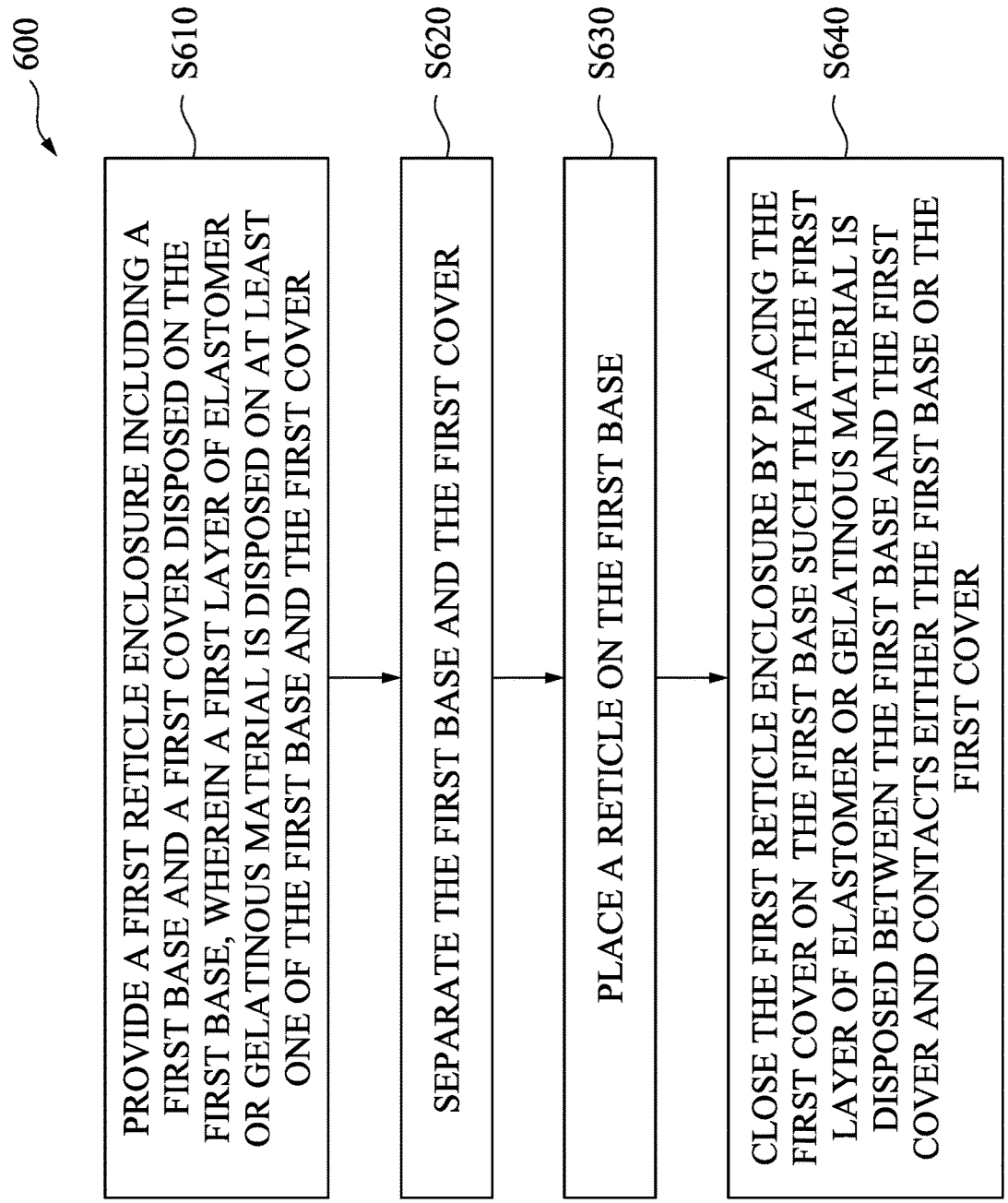
FIG. 6 illustrates a flow-chart of a method of handling a reticle enclosure, according to embodiments of the disclosure.

FIG. 6 illustrates a flow-chart of a method 600 of handling a reticle enclosure, according to some embodiments. It is understood that additional operations can be provided before, during, and after processes discussed in FIG. 6, and some of the operations described below can be replaced or eliminated, for additional embodiments of the method. The order of the operations/processes may be interchangeable and at least some of the operations/processes may be performed in a different sequence. At least two or more operations/processes may be performed overlapping in time, or almost simultaneously.

The method 600 includes an operation S610 of providing a first reticle enclosure including a first base and a first cover disposed on the first base. A first layer of elastomer or gelatinous material is disposed on at least one of the first base and the first cover. In operation S620, the first base and the first cover are separated. In operation S630, a reticle is placed on the first base. In operation S640, the first reticle enclosure is closed by placing the first cover on the first base such that the first layer of elastomer or gelatinous material is disposed between the first base and the first cover and contacts either the first base or the first cover.

Embodiments of the present disclosure are directed to reducing particles generated due to friction between the inner pod cover 355 and the inner pod base 356. By reducing the particles generated, contamination of the EUV lithography system 101, the reticle handling system 201 and/or other associated components is reduced.

It will be understood that not all advantages have been necessarily discussed herein, no particular advantage is required for all embodiments or examples, and other embodiments or examples may offer different advantages.

According to some embodiments of the present disclosure, a reticle enclosure includes a base including a first surface, a cover including a second surface and disposed on the base, wherein the base and the cover form an internal space therebetween that includes a reticle, and a layer of elastomer or gelatinous material disposed on at least one of the first surface and the second surface. The layer of elastomer or gelatinous material is disposed between the base and the cover and contacts either the base or the cover. In an embodiment, the layer of elastomer or gelatinous material is disposed only on the first surface. In an embodiment, the layer of elastomer or gelatinous material disposed only on the second surface. In an embodiment, the layer of elastomer or gelatinous material covers an entire width of the second surface. In an embodiment, the layer of elastomer or gelatinous material partially covers only a part of a width of the second surface. In an embodiment, the layer includes an elastomer including one or more selected from the group consisting of natural rubbers, styrene-butadiene block copolymers, polyisoprene, polybutadiene, ethylene propylene rubber, ethylene propylene diene rubber, silicone elastomers, fluoroelastomers, polyurethane elastomers, and nitrile rubbers. In an embodiment, the first surface and the second surface each include the layer of elastomer or gelatinous material. In an embodiment, the layers on the first surface and the second surface each include a same material. In an embodiment, the layers on the first surface and the second surface include different materials.

According to some embodiments of the present disclosure, a method of handling a reticle includes providing an outer reticle enclosure including an outer base and an outer cover, providing an inner reticle enclosure including an inner base and an inner cover, and placing a reticle on the inner base. A first layer of elastomer or gelatinous material is disposed on the outer base and a second layer of elastomer or gelatinous material is disposed on the outer cover. A third layer of elastomer or gelatinous material is disposed on the inner base and a fourth layer of elastomer or gelatinous material is disposed on the inner cover. The method further includes placing the inner cover on the inner base such that the third layer of elastomer or gelatinous material contacts the fourth layer of elastomer or gelatinous material, placing the inner reticle enclosure on the outer base, and placing the outer cover on the outer base such that the first layer of elastomer or gelatinous material contacts the second layer of elastomer or gelatinous material. In an embodiment, the first, second, third, and fourth layers each include a same material. In an embodiment, at least one of the first, second, third, and fourth layers include a different material than remaining layers.

According to some embodiments of the present disclosure, a method includes providing a first reticle enclosure including a first base and a first cover disposed on the first base, wherein a first layer of elastomer or gelatinous material is disposed on at least one of the first base and the first cover, separating the first base and the first cover, placing a reticle on the first base, and closing the first reticle enclosure by placing the first cover on the first base such that the first layer of elastomer or gelatinous material is disposed between the first base and the first cover and contacts either the first base or the first cover. In an embodiment, the first reticle enclosure is enclosed in a second reticle enclosure including a second base and a second cover, and the method includes separating the second base and the second cover of the second reticle enclosure, and removing the first reticle enclosure from the second reticle enclosure. In an embodiment, a second layer of elastomer or gelatinous material is disposed on at least one of the second base and the second cover of the second reticle enclosure, and the method further includes placing the closed first reticle on the second base of the second reticle enclosure, and closing the second reticle enclosure by placing the second cover on the second base such that the second layer of elastomer or gelatinous material is disposed between the second base and the second cover and contacts either the second base or the second cover. In an embodiment, placing the reticle on the first base includes placing the reticle one or more first restraining mechanisms on the first base and closing the first reticle enclosure includes placing the first cover on the first base such that one or more second restraining mechanisms on the first cover contact the reticle, thereby securing the reticle in the first reticle enclosure. In an embodiment, at least one of the first layer and the second layer includes an elastomer including one or more selected from the group consisting of natural rubbers, styrene-butadiene block copolymers, polyisoprene, polybutadiene, ethylene propylene rubber, ethylene propylene diene rubber, silicone elastomers, fluoroelastomers, polyurethane elastomers, and nitrile rubbers. In an embodiment, the first layer and the second layer include a same material. In an embodiment, the first layer and the second layer include different materials. In an embodiment, the first cover and the first base each include the first layer of elastomer or gelatinous material.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A reticle enclosure, comprising:
an outer pod encasing an inner pod,
wherein each of the outer pod and inner pod comprises:
a base including a first surface;
a cover including a second surface and disposed on the base,
wherein the base and the cover of the inner pod form an internal space therebetween to include a reticle,
each cover includes a top portion and a side portion extending vertically from the top portion around a periphery of the top portion,
the top portion and the side portion of the inner pod form a unitary structure made of a first protective material,
the top portion and the side portion of the outer pod form a unitary structure made of a second protective material;
a first layer of elastomer or gelatinous material disposed on an entire width of the first surface of the inner pod and a second layer of elastomer or gelatinous material disposed on an entire width of the second surface of the inner pod, such that the first and second layers interleave/interlock with each other when the first and second surfaces are mated; and
a third layer of elastomer or gelatinous material disposed on the first surface and the second surface of the outer pod.

2. The reticle enclosure of claim 1, wherein the first layer of elastomer or gelatinous material includes an elastomer including one or more selected from the group consisting of natural rubbers, styrene-butadiene block copolymers, polyisoprene, polybutadiene, ethylene propylene rubber, ethylene propylene diene rubber, silicone elastomers, fluoroelastomers, polyurethane elastomers, and nitrile rubbers.

3. The reticle enclosure of claim 1, wherein the first and second layers include the same elastomer or gelatinous material.

4. The reticle enclosure of claim 1, wherein the first and second layers of elastomer or gelatinous material have a same thickness.

5. The reticle enclosure of claim 1, wherein the third layers of elastomer or gelatinous material on the first surface and the second surface of the outer pod include different elastomer or gelatinous materials.

6. The reticle enclosure of claim 1, wherein the third layer disposed on the first surface of the outer pod is the same elastomer or gelatinous material disposed on the second surface of the outer pod.

7. The reticle enclosure of claim 1, wherein the third layer of elastomer or gelatinous material disposed on the first surface of the outer pod has a different thickness from the elastomer or gelatinous material disposed on the second surface of the outer pod.

8. A method, comprising:
providing an outer reticle enclosure including an outer base and an outer cover,
wherein the outer cover includes a first top portion and a first side portion extending vertically from the first top portion around a periphery of the first top portion, and
the first top portion and the first side portion form a first unitary structure made of a same material, and
a first layer of elastomer or gelatinous material is disposed on the outer base and a second layer of elastomer or gelatinous material is disposed on the outer cover;
providing an inner reticle enclosure including an inner base and an inner cover,
wherein the inner cover includes a second top portion and a second side portion extending vertically from the second top portion around a periphery of the second top portion, and
the second top portion and the second side portion form a second unitary structure made of a same material, and
a third layer of elastomer or gelatinous material is disposed on a first surface of the inner base and a fourth layer of elastomer or gelatinous material is disposed on a second surface of the inner cover, wherein the third layer is disposed on an entire width of the first surface of the inner base and the fourth layer is disposed on an entire width of the second surface of the inner cover, such that the third and fourth layers interleave/interlock with each other when the first and second surfaces are mated;
placing a reticle on the inner base;
placing the inner cover on the inner base such that the third layer of elastomer or gelatinous material contacts the fourth layer of elastomer or gelatinous material;
placing the inner reticle enclosure on the outer base; and
placing the outer cover on the outer base such that the first layer of elastomer or gelatinous material contacts the second layer of elastomer or gelatinous material.

9. The method of claim 8, wherein the first, second, third, and fourth layers each include the same elastomer or gelatinous material.

10. The method of claim 8, wherein at least one of the first, second, third, and fourth layers include a different elastomer or gelatinous material than remaining layers.

11. The method of claim 8, wherein at least one of the first, second, third, or fourth layers includes an elastomer including one or more selected from the group consisting of natural rubbers, styrene-butadiene block copolymers, polyisoprene, polybutadiene, ethylene propylene rubber, ethylene propylene diene rubber, silicone elastomers, fluoroelastomers, polyurethane elastomers, and nitrile rubbers.

12. A method, comprising:
providing a first reticle enclosure including a first base and a first cover disposed on the first base,
wherein the first cover includes a first top portion and a first side portion extending vertically from the first top portion around a periphery of the first top portion, and
the first top portion and the first side portion form a first unitary structure made of a first protective material, and
a first layer of elastomer or gelatinous material is disposed on an entire width of a first surface of the first base and a second layer of elastomer or gelatinous material is disposed on an entire width of a second surface of the first cover;
separating the first base and the first cover;
placing a reticle on the first base;
closing the first reticle enclosure by placing the first cover on the first base such that the first and second layers of elastomer or gelatinous material interleave/interlock with each other when the first and second surfaces are mated;
providing a second reticle enclosure including a second base and a second cover disposed on the second base,
wherein the second cover includes a second top portion and a second side portion extending vertically from the second top portion around a periphery of the second top portion, and
the second top portion and the second side portion form a second unitary structure made of a second protective material, and
a second layer of elastomer or gelatinous material is disposed on each of the second base and the second cover;
separating the second base and the second cover;
placing the first reticle enclosure on the second base;
closing the second reticle enclosure by placing the second cover on the second base such that the second layers of elastomer or gelatinous material are disposed between the second base and the second cover and contact each other.

13. The method of claim 12, further comprising:
separating the second base and the second cover of the second reticle enclosure; and
removing the first reticle enclosure from the second reticle enclosure after the closing the second reticle enclosure.

14. The method of claim 12, wherein the second layers of elastomer or gelatinous material include an elastomer selected from the group consisting of natural rubbers, styrene-butadiene block copolymers, polyisoprene, polybutadiene, ethylene propylene rubber, ethylene propylene diene rubber, silicone elastomers, fluoroelastomers, polyurethane elastomers, and nitrile rubbers.

15. The method of claim 12, wherein the first and second layers include the same elastomer or gelatinous material.

16. The method of claim 12, wherein the first and second layers have a same thickness.

17. The method of claim 12, wherein placing the reticle on the first base includes placing the reticle on one or more first restraining mechanisms on the first base and closing the first reticle enclosure includes placing the first cover on the first base such that one or more second restraining mechanisms on the first cover contact the reticle, thereby securing the reticle in the first reticle enclosure.

18. The method of claim 12, wherein the first and second layers and the second layers include different elastomer or gelatinous materials.

* * * * *